United States Patent
Kano et al.

(10) Patent No.: US 6,821,807 B2
(45) Date of Patent: Nov. 23, 2004

(54) METHOD OF FORMING NITRIDE-BASED SEMICONDUCTOR LAYER, AND METHOD OF MANUFACTURING NITRIDE-BASED SEMICONDUCTOR DEVICE

(75) Inventors: Takashi Kano, Hirakata (JP); Hiroki Ohbo, Hirakata (JP); Nobuhiko Hayashi, Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/941,982

(22) Filed: Aug. 30, 2001

(65) Prior Publication Data

US 2002/0048836 A1 Apr. 25, 2002

(30) Foreign Application Priority Data

Sep. 1, 2000 (JP) ........................................ 2000-265391

(51) Int. Cl.[7] .............................................. H01L 21/20
(52) U.S. Cl. .......................................... 438/46; 438/483
(58) Field of Search ...................... 438/22–47, 479–509

(56) References Cited

U.S. PATENT DOCUMENTS

| | | | | |
|---|---|---|---|---|
| 5,545,903 A | * | 8/1996 | Van Der Poel et al. | 257/14 |
| 5,587,014 A | * | 12/1996 | Iyechika et al. | 117/90 |
| 5,602,418 A | * | 2/1997 | Imai et al. | 257/627 |
| 5,937,274 A | * | 8/1999 | Kondow et al. | 438/47 |
| 6,072,189 A | * | 6/2000 | Duggan | 257/14 |
| 6,130,147 A | * | 10/2000 | Major et al. | 438/604 |
| 6,441,403 B1 | * | 8/2002 | Chang et al. | 257/94 |
| 2002/0020850 A1 | * | 2/2002 | Shib Ata et al. | 257/183 |

FOREIGN PATENT DOCUMENTS

| | | |
|---|---|---|
| JP | 8-8217 | 1/1996 |
| JP | 2829319 | 9/1998 |
| JP | 3026087 | 1/2000 |

OTHER PUBLICATIONS

Stacia Keller, Effect of the Trimethylgallium Flow during Nucleation Layer Growth on the Properties of GaN Grown on Sapphire, Jpn. J. Appl. Phys., Mar. 1, 1996, vol. 35, No. 3A, pp. L285–L288.

Ki Soo Kim, Effects of Growth Rate of a GaN Buffer Layer on the Properties of GaN on a Sapphire Substrate, J. Appl. Phys., Jun. 15, 1999, vol. 85, No. 12, pp. 8441–8444.

S. Nakamura, Japanese Journal of Applied Physics, vol. 30, No. 10A, pp. L1705–L1707, Oct. 1991.

I. Akasaki et al.; Journal of Crystal Growth 98, pp. 209–219, 1989.

* cited by examiner

*Primary Examiner*—Savitri Mulpuri
(74) *Attorney, Agent, or Firm*—Westerman, Hattori, Daniels & Adrian, LLP

(57) ABSTRACT

In the manufacture of a semiconductor laser device, a low temperature buffer layer is grown on a sapphire substrate at a growth rate of 25 to 30 Å/sec. On the low temperature buffer layer, an n-GaN layer, a anti-crack layer, an n-cladding layer, an n-guide layer, an MQW active layer, a p-carrier blocking layer, a p-guide layer, a p-cladding layer and a p-contact layer are grown in this order. The growth of the low temperature buffer layer at the high growth rate allows a good low temperature buffer layer to be stably provided with good reproducibility. Thus, good crystallinity and electrical characteristics can stably be provided in the above layers.

4 Claims, 2 Drawing Sheets

F I G. 2
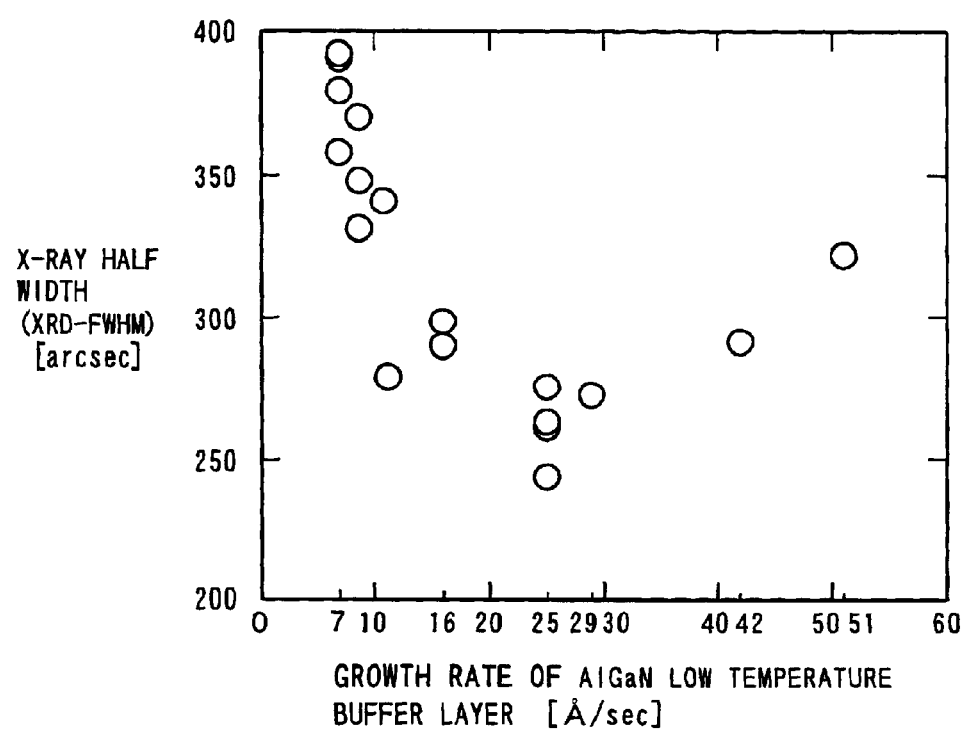

METHOD OF FORMING NITRIDE-BASED SEMICONDUCTOR LAYER, AND METHOD OF MANUFACTURING NITRIDE-BASED SEMICONDUCTOR DEVICE

BACKGROUND OF THE INVENTION

1. Field of the Invention

The present invention relates a method of manufacturing a semiconductor device having a compound semiconductor layer made of a group III-V nitride-based semiconductor (hereinafter referred to as nitride-based semiconductor) such as GaN (gallium nitride), AlN (aluminum nitride), InN (indium nitride), or TlN (thallium nitride) or mixed crystal thereof, and a method of forming a nitride-based semiconductor layer.

2. Description of the Prior Art

In recent years, GaN-based semiconductor light emitting devices have been developed for commercial use as a light emitting diode emitting blue or violet light or a semiconductor light emitting device such as a semiconductor laser device.

In the manufacture of the GaN-based semiconductor light emitting device, a GaN-based semiconductor layer is formed by epitaxy growth on an insulator substrate such as a substrate of sapphire ($Al_2O_3$), since there is no substrate made of GaN.

In this case, GaN and sapphire have different lattice constants, and the GaN-based semiconductor layer cannot be grown at a high temperature directly on the sapphire substrate. Therefore, when a GaN-based semiconductor layer is to be grown on a sapphire substrate, a low temperature buffer layer made of GaN or AlN in an amorphous state is grown on the sapphire substrate at a substrate temperature near the range of 500° C. to 600° C., and then a GaN-based semiconductor layer is grown at a high temperature near 1000° C. on the low temperature buffer layer. Thus, the GaN-based semiconductor layer can be grown on the sapphire substrate.

In the disclosure of Japanese Patent Publication No. 8-8217, for example, GaN is grown for one minute on a sapphire substrate at a substrate temperature of 500° C., and a GaN low temperature buffer layer having a film thickness of 200 Å is formed. According to Japanese Patent No. 3026087, AlN is grown for two minutes on a sapphire substrate at a substrate temperature of 650° C., and an AlN low temperature buffer layer having a film thickness of 300 Å is formed.

Meanwhile, the low temperature buffer layer has a film thickness as small as in the range from 200 Å to 500 Å, the growth rate is lowered so that the film thickness can readily be controlled at the time of growing the low temperature buffer layer. In the above Japanese Patent Publication No. 8-8217, for example, a GaN low temperature buffer layer is grown at a growth rate of 3.33 Å/sec, while according to Japanese Patent No.3026087, the growth rate is 2.5 Å/sec. Note that the growth rate of the low temperature buffer layer is adjusted by the supply amount of a material gas such as gallium and aluminum.

In the growth of the low temperature buffer layer, the low temperature buffer layer is typically grown at such a low growth rate as the above. Note that the effect of the growth rate of the low temperature buffer layer upon the crystallinity of the GaN-based semiconductor layer has not been examined, and the low temperature buffer layer is typically grown at the low growth rate as the above.

When a GaN-based semiconductor layer is grown on a low temperature buffer layer which has been grown under the optimum growth conditions, more specifically at the optimum growth temperature and into the optimum film thickness, good crystallinity and good electrical characteristics are achieved in the GaN-based semiconductor layer. Meanwhile, a GaN-based semiconductor layer grown on a low temperature buffer layer which has been grown under conditions departed from the optimum conditions does not have good crystallinity and good electrical characteristics. As a result, in order to manufacture a semiconductor light emitting device having good device characteristics and high reliability, a low temperature buffer layer must be grown under the optimum growth conditions and then a GaN-based semiconductor layer must be grown on the buffer layer.

However, the range of the optimum growth conditions for such a low temperature buffer layer would tend to be very small. The range of the optimum growth conditions would be particularly narrow for the lower temperature buffer layer made of GaN.

Therefore, when a GaN-based semiconductor layer is grown on a sapphire substrate in a new crystal growth system, the optimum growth conditions for the low temperature buffer layer must be specified. Much labor and time should be necessary for specifying the optimum growth conditions for such a low temperature buffer layer.

If the optimum growth conditions are specified for the low temperature buffer layer and the crystal growth system is set so that the conditions are satisfied, the conditions under which the low temperature buffer layer grows sometimes depart from the range of the optimum growth conditions as the condition of the crystal growth system changes. As a result, a GaN-based semiconductor layer having good crystallinity and electrical characteristics can hardly be stably provided with high reproducibility.

For example, the repetition of a crystal growth process for a long period of time in a crystal growth system causes byproducts by crystal growth to be obtained, and the byproducts accumulated in the reaction tube of the crystal growth system change the condition of the reaction tube. The change in turn causes the conditions in the growth of the low temperature buffer layer to depart from the range of the optimum growth conditions during growth. Therefore, a high quality, GaN-based semiconductor layer cannot stably be produced with good reproducibility.

SUMMARY OF THE INVENTION

It is an object of the present invention to provide a method of forming a nitride-based semiconductor layer allowing a high quality, nitride-based semiconductor layer to be stably provided with good reproducibility.

Another object of the present invention is to provide a method of manufacturing a nitride-based semiconductor device allowing a nitride-based semiconductor device having a high quality, nitride-based semiconductor layer and good device characteristics and high reliability to be stably provided with good reproducibility.

A method of forming a nitride-based semiconductor layer according to one aspect of the present invention includes the steps of growing a buffer layer of $Al_XGa_{1-X}N$ ($0 \leq X \leq 1$) on a substrate at a growth rate of at least 7 Å/sec, and growing a nitride-based semiconductor layer of $Al_aB_bIn_cTl_dGa_{1-a-b-c-d}N$ ($0 \leq a<1, 0 \leq b<1, 0 \leq c<1, 0 \leq d<1, a+b+c+d<1$) on the buffer layer.

According to the method of forming a nitride-based semiconductor layer, the buffer layer is grown at a high growth rate, and therefore a good buffer layer can stably be provided with good reproducibility regardless of changes in the condition of a crystal growth system. Therefore, a nitride-based semiconductor layer is grown on such a buffer layer, so that a nitride-based semiconductor layer having a good crystallinity and good electrical characteristics can stably be provided with good reproducibility if there is a change in the condition of the crystal growth system.

The buffer layer is preferably grown at a growth rate of at most 51 Å/sec. Thus, a good buffer layer can stably be provided with good reproducibility regardless of changes in the condition of the crystal growth system, and the film thickness of the buffer layer can readily be controlled.

The buffer layer is more preferably grown at a growth rate in the range from 16 Å/sec to 42 Å/sec. The growth of the buffer layer at the growth rate allows a good buffer layer to be stably provided with good reproducibility. Thus, a nitride-based semiconductor layer having better cyrstallinity and electrical characteristics can stably be provided with good reproducibility.

The buffer layer is more preferably grown at a growth rate in the range from 25 Å/sec to 29 Å/sec. The growth of the buffer layer at the growth rate allows an even better buffer layer to be stably provided with good reproducibility. Thus, a nitride-based semiconductor layer having even better crystallinity and electrical characteristics can stably be provided with good reproducibility.

The growth rate of the buffer layer may be adjusted by adjusting the supply amount of a group III element supplied at the time of growing the buffer layer. Thus, the growth rate of the buffer layer can readily be controlled.

The step of growing the buffer layer more preferably includes growing the buffer layer to have a film thickness in the range from 50 Å to 300 Å, and more preferably to have a film thickness in the range from 100 Å to 200 Å.

The step of growing the buffer layer preferably includes growing the buffer layer at a substrate temperature in the range from 500° C. to 700° C. and more preferably at a substrate temperature in the range from 550° C. to 650° C.

The step of growing the nitride-based semiconductor layer may include forming as the active device region a light emitting layer or an active layer in a semiconductor light emitting device, a core layer in a waveguide device, an I layer in a PIN photodiode, a pn junction portion in a photodiode or a hetero-junction bipolar transistor or a channel portion in an field effect transistor.

The step of growing the nitride-based semiconductor layer may include forming a cladding layer of a first conductivity type, an active layer and a cladding layer of a second conductivity type in this order.

A method of manufacturing a nitride-based semiconductor device according to another aspect of the present invention includes the steps of growing a buffer layer of $Al_xGa_{1-x}N$ ($0 \leq X \leq 1$) on a substrate at a growth rate of at least 7 Å/sec, and growing a nitride-based semiconductor layer including an active device region on the buffer layer and made of $Al_aB_bIn_cTl_dGa_{1-a-b-c-d}N$ ($0 \leq a<1, 0 \leq b<1, 0 \leq c<1, 0 \leq d<1, a+b+c+d<1$) on the buffer layer.

Note that the active device region in the nitride-based semiconductor device in this case corresponds to a light emitting layer or an active layer in a light emitting diode device or a semiconductor laser device, a core layer in a waveguide device, an I layer in a PIN photodiode, a pn junction portion in a photodiode or an HBT (hetero-junction bipolar transistor) or a channel portion in an FET (field effect transistor).

In the method of manufacturing a nitride-based semiconductor device, the buffer layer is grown at a high growth rate, and therefore a good buffer layer can stably be provided with good reproducibility regardless of changes in the condition of a crystal growth system. As a result, by growing a nitride-based semiconductor layer including an active device region on the buffer layer, a nitride-based semiconductor layer having good crystallinity and electrical characteristics can stably be provided with good reproducibility when there is a change in the condition of the crystal growth system. Thus, a nitride-based semiconductor device having good device characteristics and high reliability can stably be provided with good reproducibility.

The buffer layer is preferably grown at a growth rate of at most 51 Å/sec. Thus, a good buffer layer can stably be provided regardless of changes in the condition of a crystal growth system, and the film thickness of the buffer layer can readily be controlled.

The buffer layer is preferably grown at a growth rate in the range from 16 Å/sec to 42 Å/sec. The growth of the buffer layer at the growth rate allows a better buffer layer to be stably provided with good reproducibility. Thus, a nitride-based semiconductor device having better crystallinity and electrical characteristics can stably be provided with good reproducibility.

Furthermore, the buffer layer is preferably grown at a growth rate in the range from 25 Å/sec to 29 Å/sec. The growth of the buffer layer at the growth rate allows an even better buffer layer to be stably provided with good reproducibility. Thus, a nitride-based semiconductor device having better crystallinity and electrical characteristics can stably be provided with good reproducibility.

The step of growing the buffer layer may include adjusting the growth rate of the buffer layer by adjusting the supply amount of a group III element supplied at the time of growing the buffer layer. Thus, the growth rate of the buffer layer can readily be controlled.

The step of growing the buffer layer preferably includes growing the buffer layer to have a film thickness in the range from 50 Å to 300 Å and more preferably includes the step of growing the buffer layer to have a film thickness in the range from 100 Å to 200 Å.

The step of growing the buffer layer more preferably includes growing the low temperature buffer layer at a substrate temperature in the range from 500° C. to 700° C., and more preferably in the range from 550° C. to 650° C.

The step of growing the nitride-based semiconductor layer may include forming as the active device region a light emitting layer or an active layer in a semiconductor light emitting device, a core layer in a waveguide device, an I layer in a PIN photodiode, a pn junction portion in a photodiode or a hetero-junction bipolar transistor or a channel portion in an field effect transistor.

The step of growing the nitride-based semiconductor layer may include forming a cladding layer of a first conductivity type, an active layer and a cladding layer of a second conductivity type in this order.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a graph representing the relation between the growth rate of a low temperature buffer layer and the crystallinity of a GaN semiconductor layer formed on the buffer layer.

DESCRIPTION OF THE PREFERRED EMBODIMENTS

Figure 1:
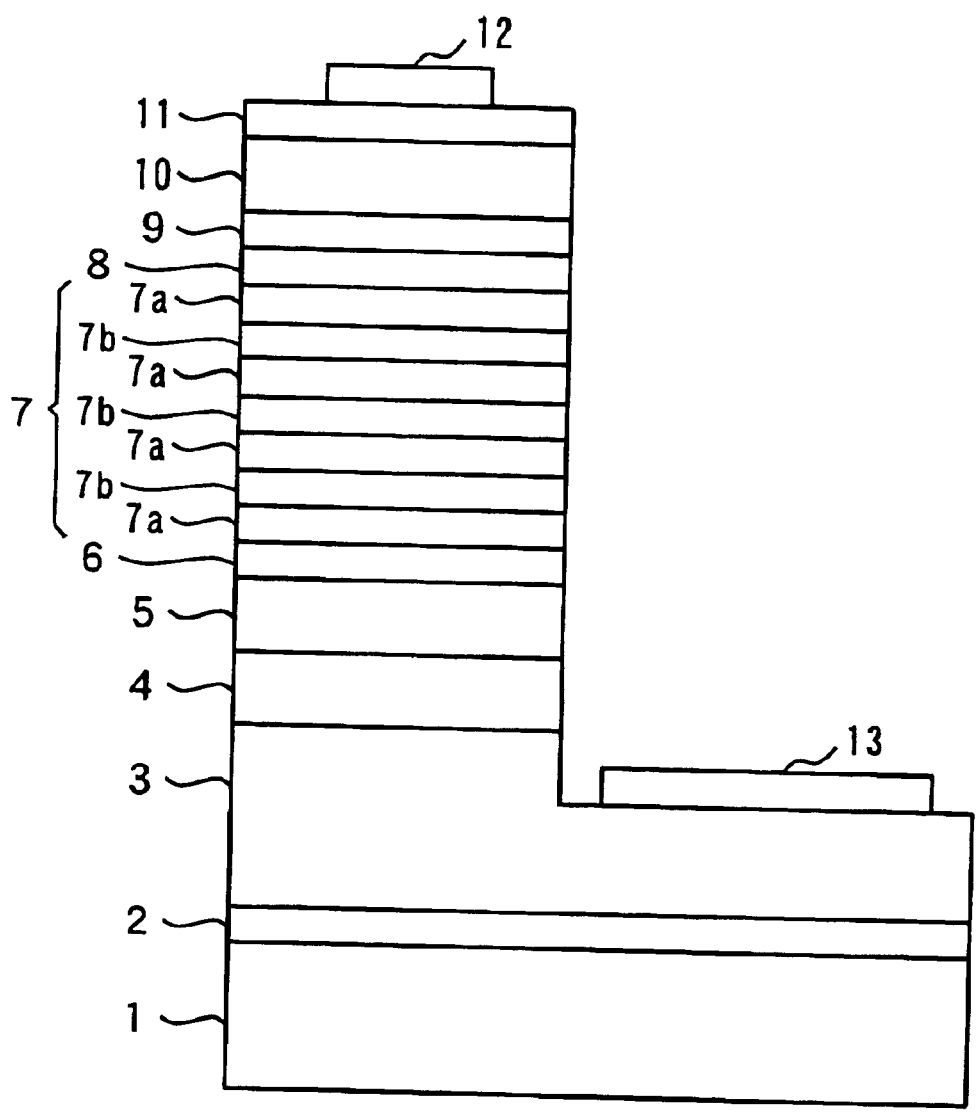
FIG. 1 is a schematic sectional view of a nitride-based semiconductor laser device manufactured by a method of manufacturing a nitride-based semiconductor device according to the present invention.

FIG. 1 is a schematic sectional view of an example of a nitride-based semiconductor device manufactured by a method of manufacturing a nitride-based semiconductor device according to the present invention. Note that herein a semiconductor laser device will be described as the semiconductor device.

In the manufacture of the semiconductor laser device shown in FIG. 1, on a sapphire substrate 1, a low temperature buffer layer 2, an n-GaN layer 3, an anti-crack layer 4, an n-cladding layer 5, an n-guide layer 6, an MQW (Multiple Quantum Well) active layer 7, a p-carrier blocking layer 8, a p-guide layer 9, a p-cladding layer 10, and a p-contact layer 11 are grown in this order for example by MOCVD (Metalorganic Organic Chemical Vapor Deposition).

In this case, the MQW active layer 7 has an MQW (Multiple Quantum Well) structure produced by placing four barrier layers 7a and three well layers 7b alternately on one another.

The substrate temperature, the film thickness and the material gas used for growing each of the layers 2 to 11 are listed in the following Table 1.

controlled so that the growth rate of the low temperature buffer layer 2 is in the range from 25 to 30 Å/sec (9 to 11 $\mu$m/h).

As described above, in the manufacture of the conventional semiconductor laser device, the low temperature buffer layer is grown at a growth rate as low as 3.33 Å/sec as disclosed by Japanese Patent Publication No. 8-8217 or 2.5 Å/sec as disclosed by Japanese Patent No.3026087. In contrast, according to the embodiment, the low temperature buffer layer 2 is grown at a growth rate about ten times as high as that of the conventional examples.

The growth at the high growth rate allows a good low temperature buffer layer 2 to be provided in this case regardless of changes in the state of the MOCVD system. As a result, the layers 3 to 11 having good crystallinity and electrical characteristics may be grown on the low temperature buffer layer 2 with high reproducibility, if the condition of the MOCVD system changes.

For example, if the crystal growth is repeated for a long period of time in the MOCVD system, byproducts accumulate in the reaction tube of the MOCVD system as described above, and the condition of the reaction tube changes. In this case, the low temperature buffer layer 2 is grown at a high growth rate as described above, so that a good low temperature buffer layer 2 can stably be provided with high reproducibility regardless of the change in the reaction tube. Therefore, in the layers 3 to 11 grown on the low temperature buffer layer 2, good crystallinity and electrical characteristics can stably be provided with high reproducibility.

When a new MOCVD system is used for crystal growth, the low temperature buffer layer 2 is grown at a high growth

TABLE 1

| Layer | composition | film thickness | substrate temp. as growth (° C.) | material gas |
|---|---|---|---|---|
| low temperature buffer layer 2 | $Al_{0.5}Ga_{0.5}N$ | 140Å | 600 | TMG, TMA, $NH_3$ |
| n-GaN layer 3 | Si-doped GaN | 4.50 $\mu$m | 1080 | TMG, $NH_3$, $SiH_4$ |
| anti-crack layer 4 | Si-doped $Al_{0.07}Ga_{0.93}N$ | 0.18 $\mu$m | 1080 | TMG, TMA, $NH_3$, |
|  | Si-doped CaN | (30Å each × 31) |  | $SiH_4$ |
| n-cladding layer 5 | Si-doped CaN $Al_{0.07}Ga_{0.93}N$ | 1.00 $\mu$m | 1080 | TMG, TMA, $NH_3$, $SiH_4$ |
| n-guide layer 6 | Si-doped CaN | 0.100 $\mu$m | 1080 | TMG, $NH_3$, $SiH_4$ |
| MQW active layer 7 Barrier layer 7a | Si-doped $In_{0.05}Ga_{0.95}N$ | 130Å each × 4 | 800 | TEG, TMI, $NH_3$, |
| well layer 7b | Si-doped $In_{0.13}Ga_{0.87}N$ | 50Å each × 3 |  | $SiH_4$ |
| p-carrier blocking layer 8 | Mg-doped $Al_{0.2}Ga_{0.8}N$ | 200Å | 1080 | TMG, TMA, $NH_3$, $Cp_2Mg$ |
| p-guide layer 9 | Mg-doped GaN | 0.100 $\mu$m | 1080 | TMG, $NH_3$, $Cp_2Mg$ |
| p-cladding layer 10 | Mg-doped $Al_{0.07}Ga_{0.93}N$ | 0.28 $\mu$m | 1080 | TMG, TMA, $NH_3$, $Cp_2Mg$ |
| p-contact layer 11 | Mg-doped GaN | 0.05 $\mu$m | 1080 | TMG, $NH_3$, $Cp_2Mg$ |

Note that in the column of the material gas in the Table 1, TMG represents trimethylgallium, TMA trimethylaluminum, and TEG triethylgallium, and TMI trimethylindium. In this case, TMG and TEG are both a gallium supply source, TMA an aluminum supply source, TMI an indium supply source, and $NH_3$ a nitrogen supply source. $SiH_4$ (silane gas) is an n-type dopant gas and a supply source of an n-type dopant, Si. Meanwhile, $Cp_2Mg$ (cyclopentadienylmagnesium gas) is a p-type dopant gas and a supply source of a p-type dopant, Mg.

In the above, when the low temperature buffer layer 2 is grown on the sapphire substrate 1, the supply amount of TMG and TMA, i.e., a group III element supply source is rate as described above, so that a good low temperature buffer layer 2 can stably be provided with high reproducibility if the growth conditions are not specified into details. In the layers 3 to 11 grown on the low temperature buffer layer 2, good crystallinity and electrical characteristics can be provided. In this case, the layers 3 to 11 having good crystallinity and electrical characteristics can stably be provided with high reproducibility without specifying into details the optimum conditions for growing the low temperature buffer layer 2. Therefore, the labor and time otherwise required for specifying the growth conditions for the low temperature buffer layer 2 can be saved.

After the layers 3 to 11 are grown on the sapphire substrate 1 as described above, a part of the region from the p-contact layer 11 to the n-GaN layer 3 is etched away to expose a part of the n-GaN layer 3.

Furthermore, a p-electrode 12 is formed in a prescribed region of the p-contact layer 11, and an n-electrode 13 is formed on a prescribed region of the exposed n-GaN layer 3.

Thus, the semiconductor laser device shown in FIG. 1 is manufactured.

In the method of manufacturing the semiconductor laser device described above, the low temperature buffer layer 2 is grown at a high growth rate, and therefore the layers 3 to 11 having good crystallinity and electrical characteristics can stably be provided with high reproducibility. As a result, according to the manufacturing method, a semiconductor laser device having good device characteristics and high reliability can stably be provided with high reproducibility regardless of changes in the condition of the crystal growth system.

The relation between the growth rate of a low temperature buffer layer and the crystallinity of a semiconductor layer formed on the low temperature buffer layer was examined and the result will be now described.

Here, a plurality of low temperature buffer layers are grown on a sapphire substrate at different growth rates and with different supply amounts of TMG and TMA, and a GaN layer was grown on each of the low temperature buffer layers. The crystallinity of each GaN layer was evaluated based on the half width of the X-ray diffraction peak, which will be detailed below.

In this case, the sapphire substrate was provided in an MOCVD system, into which $H_2$ was supplied, and the temperature of the sapphire substrate was raised to 1120° C. in the $H_2$ atmosphere. The surface of the sapphire substrate was thus $H_2$-cleaned. Then, the substrate temperature is lowered to 600° C., and a low temperature buffer layer of $Al_{0.6}Ga_{0.4}N$ was grown to have a film thickness of about 120 Å as $NH_3$, TMG, and TMA were supplied in prescribed supply amounts.

Note that in this case, the supply amounts of TMG and TMA were varied as the supply amount of $NH_3$ was kept constant, so that the plurality of low temperature buffer layers were grown at different growth rates.

After the low temperature buffer layer was grown as described above, the supply of TMG and TMA was stopped as only the $NH_3$ continued to be supplied, and the substrate temperature was raised to 1080° C. When the substrate temperature was stable at 1080° C., TMG was again supplied and a GaN layer as thick as 4 μm was grown on the low temperature buffer layer. Then, the half width of the X-ray diffraction peak of the GaN layer thus grown was measured, and the crystallinity of the GaN layer was examined.

The process of growing the GaN layer on the low temperature buffer layer as described above was repeated for a long period of time for each growth rate. The result is given in FIG. 2.

As shown in FIG. 2, when the growth rate of the low temperature buffer layer is in the range from 7 to 51 Å/sec, the X-ray half width of the GaN layer formed on the low temperature buffer layer is as small as 400 sec or less, and a GaN layer having good crystallinity can stably be produced with good reproducibility.

Particularly when the growth rate of the low temperature buffer layer is in the range from 16 to 42 Å/sec, the X-ray half width is about 300 sec, and a GaN layer having good crystallinity can be provided with good reproducibility. When the growth rate of the low temperature buffer layer is in the range from 25 to 29 Å/sec, the X-ray half width is about 250 sec, and a GaN layer having better crystallinity can be provided with good reproducibility. As can be seen, when the growth rate of the low temperature buffer layer is in the above ranges, a high quality GaN layer can stably be provided with good reproducibility.

A section of the interface between the low temperature buffer layer and the GaN layer was viewed in the <11 $\overline{2}$0>direction of the GaN using a transmission electron microscope (TEM) at a magnification of about 2,000,000, and the following features were discovered.

When the growth rate of the low temperature buffer layer was 7 Å/sec, a disordered contrast was observed in the section of the low temperature buffer layer. The interface between the low temperature buffer layer and the GaN was disordered. Therefore, defects generated in the initial stage of the growth of the GaN remained in the GaN layer, and there were many through defects in the GaN layer. As a result, the X-ray half width was 400 sec. When defects on the surface of the GaN layer were examined for the etch pit density, the etch pit density was $4 \times 10^9$ cm$^{-2}$.

When the growth rate of the low temperature buffer layer was 25 Å/sec, a section of the low temperature buffer layer had many line shaped contrasts in the C plane direction, i.e., in the direction parallel to the sapphire substrate.

In the interface between the low temperature buffer layer and the GaN, a trapezoid was observed. The trapezoid had inclined sides both forming an angle of about 60° with respect to the sapphire substrate and upper and bottom sides parallel to the sapphire substrate on the low temperature buffer layer. These defects are on the low temperature buffer layer and therefore are believed to be defects caused in the GaN in the initial stage of the growth.

The direction of the inclined sides of the trapezoid formed by the defects in the GaN growth initial stage is calculated based on the lattice constant of GaN. The direction forms about 60° with respect to the sapphire substrate, and therefore the trapezoid forms a plane equivalent to the ($\overline{1}$101) plane of GaN. The upper side of the trapezoid is parallel to the sapphire substrate and therefore corresponds to the (0001) plane of GaN. Since GaN is sixfold symmetrical, the trapezoid formed by the defects as it is shown three-dimensionally has a six-sided pyramid having six sides equivalent to the GaN ($\overline{1}$101) plane and the upper surface of the GaN (0001) plane.

More specifically, when the growth rate of the low temperature buffer layer is 25 Å/sec, defects caused in the initial stage of the growth of GaN turn in the direction of the six-sided pyramid having the six sides equivalent to the GaN ($\overline{1}$101) plane and the upper surface made of the GaN (0001) plane. As a result, the defects caused in the initial stage of the growth of the GaN can be reduced by cancellation, and a good GaN layer having an X-ray half width of 250 sec would be obtained. Note that defects on the surface of the GaN layer was examined for the etch pitch density, and the etch pit density was as small as a little less than $1 \times 10^9$ cm$^{-2}$.

The repetition of the growth process of the low temperature buffer layer and the GaN layer for a long period of time causes byproducts by the crystal growth to accumulate in the reaction tube of the MOCVD device, and the condition of the reaction tube of the device changes. However, the growth of the low temperature buffer layer in the described range of growth rate allows a high quality GaN layer to be stably provided with high reproducibility for a long period of time even if the condition of the MOCVD system changes.

As in the foregoing, in the manufacture of the semiconductor laser device, the growth rate of the low temperature buffer layer is set in the range from 7 to 51 Å/sec, preferably from 16 to 42 Å/sec, and more preferably from 25 to 29 Å/sec. Thus, a good low temperature buffer layer can be provided, and good crystallinity and electrical characteristics can be provided with good reproducibility in each layer grown on the low temperature buffer layer. As a result, the semiconductor laser device having good device characteristics and high reliability can stably be provided with good reproducibility.

Note that in the semiconductor laser device shown in FIG. 1, the low temperature buffer layer is made of AlGaN, but the composition of the low temperature buffer layer is by no means limited to this. When a low temperature buffer layer of GaN or a low temperature buffer layer of AlN is formed, the growth rate of the low temperature buffer layer is set to be high as described above, and the same effects as those in the case of forming the AlGaN buffer layer result.

In the above description, the film thickness of the low temperature buffer layer 2 is 140 Å, but the film thickness of the low temperature buffer layer 2 is not limited to this. The film thickness of the low temperature buffer layer 2 needs only be in the range from 50 Å to 300 Å, more desirably from 100 Å to 200 Å.

Also in the above description, the substrate temperature at the time of growing the low temperature buffer layer 2 is 600° C., but the substrate temperature at the time is not limited to this. The substrate temperature at the time of growing the low temperature buffer layer 2 needs only be in the range from 500° C. to 700° C., more desirably in the range from 550° C. to 650° C.

The compositions of the layers 3 to 11 other than the low temperature buffer layer 2 are by no means limited to the above. As long as the layers 3 to 11 are made of a nitride-based semiconductor including at least one of aluminum, gallium, indium, boron, and thallium, other compositions may be employed.

In the above description, the semiconductor laser device includes the sapphire substrate 1, while a substrate of SiC, $MgAl_2O_4$, MgO, ZnO or the like other than the sapphire substrate may be used. Also in this case, the same effects as the above result.

Also in the above description, the layers 2 to 11 are grown according to the MOCVD method, while other crystal growth methods such as MBE (Molecular Beam Epitaxy) can be employed to grow these layers 2 to 11. In this case, the same effects as the above result.

Furthermore, in the above description, an n-type semiconductor layer and a p-type semiconductor layer are formed in this order on the substrate, while the order may be reversed.

Note that in the above description, the present invention is applied to a semiconductor laser device, while the invention may be applied to a semiconductor light emitting device other than the semiconductor laser device such as a light emitting diode, or the invention may be applied to a semiconductor device other than a semiconductor light emitting device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a nitride-based semiconductor device, comprising the steps of:

growing a buffer layer of $Al_XGa_{1-X}N$ ($\alpha \leq X \leq 1$) on a substrate at a growth rate in the range from 25 Å/sec to 42 Å/sec; and growing a nitride-based semiconductor layer including an active device region on said buffer layer and made of $Al_aB_bIn_cTl_dGa_{1-a-b-c-d}N$ ($0 \leq a < 1$, $0 \leq b \leq 1$, $0 \leq c < 1$, $0 \leq d < 1$, a+b+c+d<1) on said buffer layer, wherein said step of growing the buffer layer comprises growing said buffer layer to have a film thickness in the range from 50 Å to 300 Å.

2. The method of manufacturing a nitride-based semiconductor device according to claim 1, wherein said step of growing the buffer layer comprises growing said buffer layer at a growth rate in the range from 25 Å/sec to 29 Å/sec.

3. The method of manufacturing a nitride-based semiconductor device according to claim 1, wherein said step of growing the nitride-based semiconductor layer comprises forming as said active device region a light emitting layer or an active layer in a semiconductor light emitting device, a core layer in a waveguide device, an I layer in a PIN photodiode, a pn junction portion in a photodiode or a hetero-junction bipolar transistor or a channel portion in a field effect transistor.

4. The method of manufacturing a nitride-based semiconductor device according to claim 1, wherein said step of growing the nitride-based semiconductor layer comprises forming a cladding layer of a first conductivity type, an active layer and a cladding layer of a second conductivity type in this order.

* * * * *